United States Patent
Kamikawa et al.

(10) Patent No.: US 7,529,283 B2
(45) Date of Patent: May 5, 2009

(54) NITRIDE SEMICONDUCTOR LASER DEVICE AND METHOD FOR FABRICATION THEREOF

(75) Inventors: Takeshi Kamikawa, Mihara (JP); Yoshika Kaneko, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/877,551

(22) Filed: Oct. 23, 2007

(65) Prior Publication Data

US 2008/0080578 A1    Apr. 3, 2008

Related U.S. Application Data

(63) Continuation of application No. 11/022,892, filed on Dec. 28, 2004, now abandoned.

(30) Foreign Application Priority Data

Jan. 5, 2004    (JP)    ............................. 2004-000328

(51) Int. Cl.
H01S 5/00    (2006.01)
H01L 33/00    (2006.01)
(52) U.S. Cl. .................. 372/43.01; 257/79; 257/94; 257/97
(58) Field of Classification Search .................. 257/79, 257/94, 97, 103; 372/43.01
See application file for complete search history.

(56) References Cited

U.S. PATENT DOCUMENTS

| | | | |
|---|---|---|---|
| 5,528,615 A | 6/1996 | Shima | |
| 5,648,668 A | 7/1997 | Kasai | |
| 6,117,713 A | 9/2000 | Hoshino et al. | |
| 6,153,010 A * | 11/2000 | Kiyoku et al. | ................. 117/95 |
| 6,177,688 B1 | 1/2001 | Linthicum et al. | |
| 6,316,785 B1 | 11/2001 | Nunoue et al. | |
| 6,335,546 B1 | 1/2002 | Tsuda et al. | |
| 6,362,515 B2 * | 3/2002 | Hayakawa | .................. 257/639 |

(Continued)

FOREIGN PATENT DOCUMENTS

JP    2000-164986    6/2000

(Continued)

OTHER PUBLICATIONS

Wolf et al., "Silicon . . . Era"; 1986 pp. 521-525, Lattice Press.

*Primary Examiner*—Minsun Harvey
*Assistant Examiner*—Phillip Nguyen
(74) *Attorney, Agent, or Firm*—Morrison & Foerster LLP

(57) ABSTRACT

A nitride semiconductor light-emitting device includes a nitride semiconductor substrate of which at least part of a surface is formed from a nitride semiconductor and a nitride film semiconductor growth layer laid on the surface of the nitride semiconductor substrate. A carved region in the shape of a depressed portion may be formed on the surface of the nitride semiconductor substrate. The carved region may have an inverted tapered shape or a tapered shape in cross-section. Alternatively, or additionally, the nitride film semiconductor growth layer may include a gallium nitride film or an aluminum containing gallium nitride film where the nitride film semiconductor growth layer makes contact with the nitride semiconductor substrate. Alternatively, or additionally, the nitride film semiconductor growth layer may include a light-emitting portion formed at a location 20 μm or more away from the carved region.

7 Claims, 10 Drawing Sheets

U.S. PATENT DOCUMENTS

| | | | |
|---|---|---|---|
| 6,500,257 B1 * | 12/2002 | Wang et al. | 117/95 |
| 6,566,231 B2 * | 5/2003 | Ogawa et al. | 438/448 |
| 6,603,146 B1 | 8/2003 | Hata et al. | |
| 6,864,160 B2 * | 3/2005 | Linthicum et al. | 438/479 |
| 6,911,351 B2 * | 6/2005 | Kidoguchi et al. | 438/46 |
| 6,984,841 B2 * | 1/2006 | Tsuda et al. | 257/12 |
| 7,109,049 B2 | 9/2006 | Takakura et al. | |
| 7,163,876 B2 * | 1/2007 | Nagai et al. | 438/478 |
| 7,361,518 B2 | 4/2008 | Kamikawa | |
| 2001/0025989 A1 | 10/2001 | Shibuya et al. | |
| 2001/0030329 A1 | 10/2001 | Ueta et al. | |
| 2002/0013036 A1 | 1/2002 | Gehrke et al. | |
| 2002/0017653 A1 | 2/2002 | Chuang | |
| 2002/0056846 A1 * | 5/2002 | Tsuda et al. | 257/86 |
| 2002/0115267 A1 | 8/2002 | Tomiya et al. | |
| 2002/0137249 A1 * | 9/2002 | Ishida et al. | 438/47 |
| 2003/0143771 A1 * | 7/2003 | Kidoguchi et al. | 438/46 |
| 2004/0041156 A1 | 3/2004 | Tsuda et al. | |
| 2004/0113141 A1 | 6/2004 | Isuda et al. | |
| 2005/0151153 A1 | 7/2005 | Kamikawa et al. | |
| 2005/0186694 A1 | 8/2005 | Takakura et al. | |
| 2005/0277212 A1 | 12/2005 | Kamikawa | |
| 2006/0060866 A1 * | 3/2006 | Tezen | 257/79 |
| 2006/0166478 A1 * | 7/2006 | Sugahara et al. | 438/602 |
| 2007/0051961 A1 | 3/2007 | Kamikawa et al. | |
| 2007/0066029 A1 | 3/2007 | Kamikawa et al. | |
| 2008/0166852 A1 | 7/2008 | Kamikawa | |

FOREIGN PATENT DOCUMENTS

| | | |
|---|---|---|
| JP | 2000-277437 | 10/2000 |
| JP | 2000-299497 | 10/2000 |
| JP | 2002-246698 | 8/2002 |
| JP | 2002-319733 | 10/2002 |
| JP | 2003-124573 | 4/2003 |
| JP | 2003-153621 | 5/2003 |
| JP | 2004-356454 | 12/2004 |
| WO | WO-02/080242 | 10/2002 |

* cited by examiner

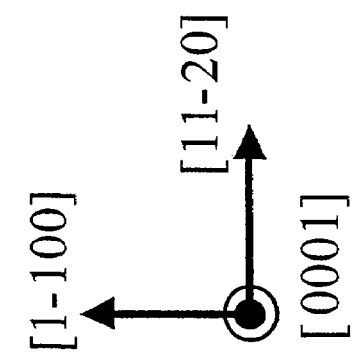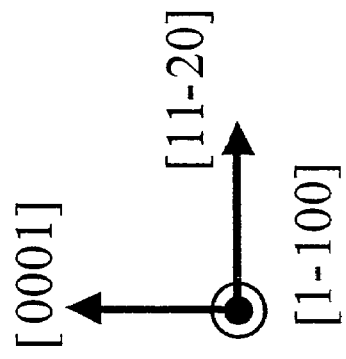
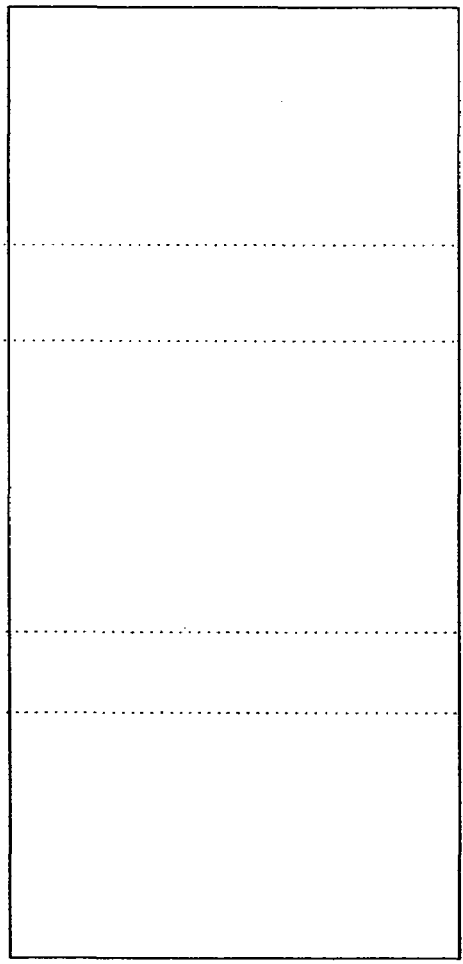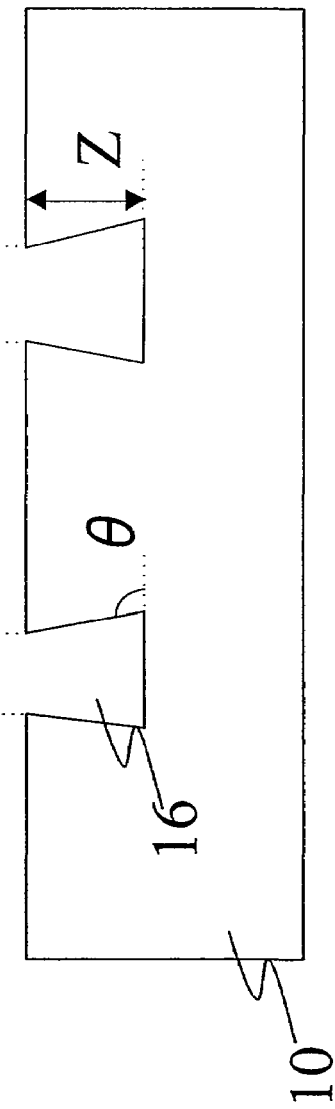
FIG. 3A
FIG. 3B

PRIOR ART

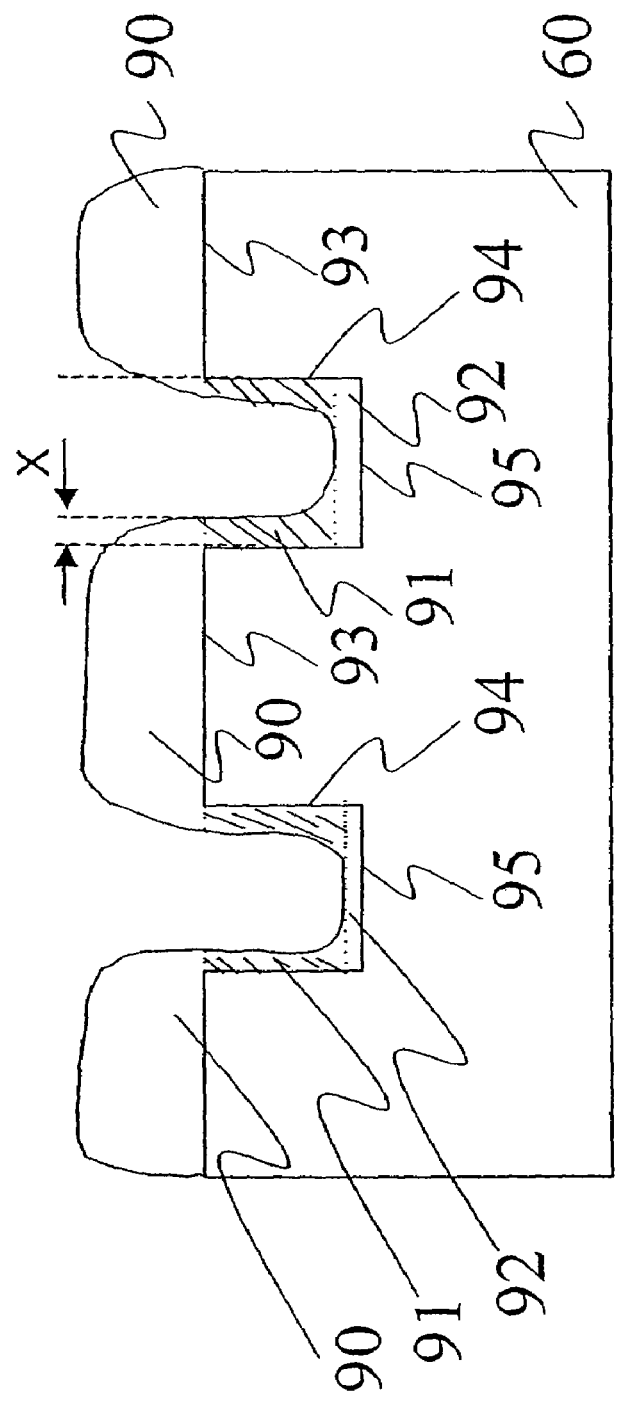
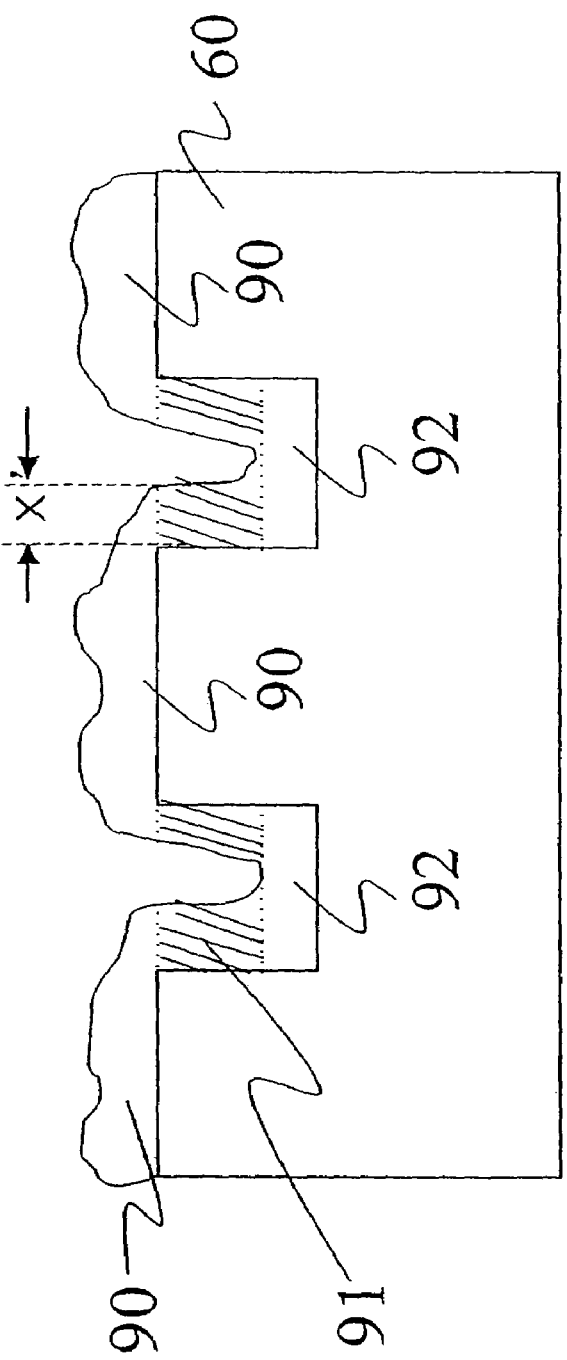
FIG. 9A
PRIOR ART
FIG. 9B
PRIOR ART

PRIOR ART

NITRIDE SEMICONDUCTOR LASER DEVICE AND METHOD FOR FABRICATION THEREOF

This application is a Continuation of application Ser. No. 11/022,892, filed on Dec. 28, 2004, which claims priority on 35 U.S.C. § 119(a) from Patent Application No. 2004-000328 filed in Japan on Jan. 5, 2004, the entire contents of which are hereby incorporated by reference.

BACKGROUND OF THE INVENTION

1. Field of the Invention

The present invention relates to a nitride semiconductor laser device, and to a method for fabricating a nitride semiconductor laser device. More particularly, the present invention relates to a nitride semiconductor laser device that uses as the substrate thereof a nitride semiconductor.

2. Description of Related Art

One feature of nitride semiconductors, for example GaN, AlGaN, GaInN, and AlGaInN, is that they have higher band gap energies than AlGaInAs-based and AlGaInP-based semiconductors. Another feature of such nitride semiconductors is that they are direct-transition semiconductor materials.

Having these features, nitride semiconductors have recently been receiving much attention as materials for building semiconductor light-emitting devices, such as semiconductor lasers that emit light in a short-wavelength region ranging from ultraviolet (blue) to green and light-emitting diodes that emit light in a wide wavelength range covering from ultraviolet (blue) to red. With this trend, various applications of nitride semiconductors have been researched and developed in the fields of high-density optical disks, full-color displays, environmental and medical equipment, and many other fields.

Nitride semiconductors have also been arousing expectations as materials for building high-output high-frequency electronic devices that can operate at high temperatures. Moreover, nitride semiconductors have higher thermal conductivity than GaAs-based or other semiconductors, and are thus expected to find applications in devices that operate at high temperatures and at high outputs. Furthermore, nitride semiconductors do not require materials comparable with arsenic (As) used in AlGaAs-based semiconductors or cadmium (Cd) used in ZnCdSSe-based semiconductors, or materials from which such materials are obtained, such as arsine ($AsH_3$). Thus, nitride semiconductors are also expected as compound semiconductor materials that are environment-friendly.

However, conventionally, the fabrication of nitride semiconductors suffers from extremely low yields, meaning that, relative to the total number of nitride semiconductor laser devices fabricated on a single wafer, the number of usable ones is very small. One reason for low yields is the development of cracks in the nitride semiconductor growth layer. Cracks may develop both from faults in the substrate and from faults in the nitride semiconductor growth layer laid on top of the substrate.

Theoretically, it is desirable that a nitride semiconductor growth layer, such as one formed from GaN, be grown and formed on a GaN substrate. To date, however, there has been developed no high-quality GaN single crystal substrate of which the lattice matches with that of GaN. For this reason, as substrates of which the lattice constant differs comparatively little from that of GaN, SiC substrates are occasionally used instead.

However, SiC substrates are expensive, are difficult to form in large diameters, and are liable to produce tensile strains, with the result that they are more liable to develop cracks. In addition, any material for the substrate of a nitride semiconductor is required to withstand a growth temperature as high as about 1,000° C. and be resistant to discoloration and corrosion in the atmosphere of ammonia gas, which is the material for GaN.

For the reasons discussed above, it is sapphire substrates that are typically used as substrates on top of which to lay a nitride semiconductor growth layer. However, a sapphire substrate exhibits comparatively severe lattice mismatch (about 13%). To overcome this, on top of a sapphire substrate, a buffer layer formed from GaN, AlN, or the like is formed by low-temperature growth, and then, on top of the buffer layer, a nitride semiconductor growth layer is grown. Even this cannot completely eliminate strains, with the result that cracks still develop depending on the composition and film thickness of the growth layer and other conditions.

To overcome this, according to one conventionally proposed method for fabricating a nitride semiconductor device using a GaN substrate, a nitride semiconductor laser device is produced by using a GaN substrate that has previously been so processed as to minimize the effects of such regions thereon as exhibit poor crystallinity (Japanese Patent Application Laid-Open as No. 2003-124573 on Apr. 25, 2003, hereinafter referred to as Patent Publication 1).

However, it is not only from faults in the substrate that cracks develop. When a nitride semiconductor laser device is produced, a nitride semiconductor growth layer is laid on top of a substrate. Here, the nitride semiconductor growth layer is composed of different kinds of film, such as GaN, AlGaN, InGaN, etc. Since these individual films of which the nitride semiconductor growth layer is composed have different lattice constants, lattice mismatch arises, resulting in the development of cracks.

To overcome this, according to another conventionally proposed method, after the growth of a nitride semiconductor growth layer, depressions are formed on the surface thereof, without the surface being made flat. This helps reduce cracks (Japanese Patent Application Laid-Open as No. 2002-246698 on Aug. 30, 2002, hereinafter referred to as Patent Publication 2).

By this method, it is possible to reduce both cracks that develop from faults in the substrate and cracks that develop from lattice mismatch between the individual films of which the nitride semiconductor growth layer formed on top of the substrate is composed.

In a case where, as described above, a nitride semiconductor laser device is produced by using a previously processed substrate, the nitride semiconductor growth layer thereof is structured as shown in FIG. 7.

Specifically, on top of the etched surface of an n-type GaN substrate 60 (see FIGS. 6A and 6B), a nitride semiconductor growth layer 11 is formed as described below.

For example, on top of the n-type GaN substrate 60, the following layers are laid on top of one another in the order named: a 2.0 µm thick n-type GaN layer 70; a 1.5 µm thick n-type $Al_{0.062}Ga_{0.938}N$ first clad layer 71; a 0.2 µm thick n-type $Al_{0.1}Ga_{0.9}N$ second clad layer 72; a 0.1 µm thick n-type $Al_{0.062}Ga_{0.938}N$ third clad layer 73; a 0.1 µm thick n-type GaN guide layer 74; a multiple quantum well active layer 75 composed of three pairs of a 4 nm thick InGaN layer and a 8 nm thick GaN layer laid on top of one another; a 20 nm thick p-type $Al_{0.3}Ga_{0.7}N$ evaporation prevention layer 76; a 0.08 μm thick p-type GaN guide layer 77; a 0.5 μm thick p-type $Al_{0.062}Ga_{0.938}N$ clad layer 78; and a 0.1 μm thick p-type GaN contact layer 79.

In this way, by laying the nitride semiconductor growth layer 11 on the previously processed n-type GaN substrate 60 by MOCVD (metal organic chemical vapor deposition), a nitride semiconductor wafer having depressions on the surface of the semiconductor growth layer 11 as shown in FIGS. 6A and 6B is produced.

In crystallography, it is customary to add an overscore to the absolute value of the index indicating a plane or orientation of a crystal if the index is negative. However, in the present specification, since such notation is impossible, a negative index will be indicated by placing the minus sign "−" in front of the absolute value thereof.

In the present specification, some terms are used in specific senses. A "trough" denotes a depressed portion formed in the shape of a stripe on the surface of a previously processed substrate as shown in FIGS. 6A and 6B. A "ridge" denotes an elevated portion formed likewise in the shape of a stripe.

A "previously processed substrate" denotes a substrate produced by forming troughs and ridges on the surface of a nitride semiconductor substrate or on the surface of a nitride semiconductor growth layer laid on top of the surface of a nitride semiconductor substrate.

In the n-type GaN substrate 60 shown in FIGS. 6A and 6B, stripe-shaped troughs are formed in the [1-100] direction by a dry etching technique such as RIE (reactive ion etching). These troughs are 5 μm wide, are 3 μm deep, and are formed with a period of 400 μm between adjacent troughs. On top of the so etched n-type GaN substrate 60, the nitride semiconductor growth layer 11, having a multiple-layer structure as shown in FIG. 7, is formed by a growth method such as MOCVD.

However, producing a nitride semiconductor laser device by the technique disclosed in Patent Publication 2 mentioned above, specifically by using a previously processed GaN substrate and epitaxially growing a nitride semiconductor growth layer on top of the substrate by MOCVD or the like, has been confirmed to contribute indeed to the reduction of cracks but not to a satisfactory improvement in yields.

This is because the depressions left on the nitride semiconductor growth layer degrade the flatness of the films of which it is composed. With degraded flatness, the individual layers have thicknesses varying from one place to another within the nitride semiconductor growth layer. This causes the characteristics (such as FFP (far-field pattern), threshold current, and slope) of the produced nitride semiconductor laser devices vary from one device to another. This reduces the number of devices of which the characteristics fall within the desired ranges. Thus, to improve yields, it is necessary not only to reduce the development of cracks but also to improve the flatness of the individual films.

FIG. 8 shows the flatness, as actually measured in the [1-100] direction, of the surface of a nitride semiconductor wafer formed as shown in FIGS. 6A, 6B, and 7. The measurements were taken under the following conditions: measurement length=600 μm; measurement duration=3 s; probe needle pressure=30 mg; and horizontal resolution=1 μm per sample. The graph in FIG. 8 shows that, within the 600 μm wide region in which the measurements were taken, the level difference between the highest and lowest points was 200 nm.

This variation in flatness results from the fact that, as shown in FIG. 6B, the film thicknesses of the individual layers of the nitride semiconductor growth layer 11 laid on top of the surface of the n-type GaN substrate 60 vary from one place to another within the wafer.

Consequently, the characteristic of nitride semiconductor laser devices greatly vary according to where on the surface of a wafer they are produced. Moreover, the thickness of the Mg-doped p-type layer (i.e., the sum of the layer thicknesses from the p-type GaN guide layer 77 through the p-type GaN contact layer 79), which thickness greatly affects the characteristic of nitride semiconductor laser devices, greatly varies according to where on the surface of the substrate it is formed.

In the process of forming a ridge structure as a current-narrowing structure, whereas ridges are left in the shape of 2 μm wide stripes, the rest is etched off by a dry etching technique using an ICP (inducting coupled plasma) machine.

Thus, if the thickness of the p-type layer before etching varies from one place to another within the wafer surface, the film thickness of the p-type layer that remains after etching, which thickness most greatly affects the characteristics of nitride semiconductor laser devices, accordingly varies greatly from one place to another within the wafer surface.

Because of the factors discussed above, the layer thickness varies among individual nitride semiconductor laser devices. In addition, even within a single nitride semiconductor laser device, while the thickness of the remaining p-type layer is almost zero at some places, it is considerably great at other places. This variation in the thickness of the remaining p-type layer greatly affects the characteristics, including the life, of nitride semiconductor laser devices.

Next, using a light interference microscope, the thickness of the p-type layer before a ridge structure was formed by etching was measured. Here, with the design value of the thickness set at 0.700 μm, 20 measurements were taken respectively at different places within the wafer surface, and the mean deviation σ of those measurements were calculated. The mean deviation σ indicates the variation of the film thickness among the 20 measurements thereof. The greater the mean deviation σ, the greater the variation of the various characteristic, such as FFP (far-field pattern), threshold current, and slope efficiency, of nitride semiconductor laser devices.

The mean deviation σ of the thickness of the p-type layer formed on the wafer produced by growing the nitride semiconductor growth layer 11 on top of the conventional n-type GaN substrate 60 as shown in FIGS. 6A and 6B was 0.07. To satisfactorily reduce the variation of the characteristics of nitride semiconductor laser devices, the mean deviation σ needs to be reduced to 0.01 or lower. The mean deviation σ of the thickness of the p-type layer formed on the wafer produced by growing the nitride semiconductor growth layer 11 shown in FIGS. 6A and 6B, however, does not meet this requirement. Incidentally, the mean deviation is calculated by adding together the differences of the individual values of the 20 measurements of the layer thickness from the mean value of the 20 measurements and then dividing the result by 20.

This large variation in layer thickness within the wafer surface is considered to result from the fact that, when the films are epitaxially grown in the ridge portions of the previously processed substrate, their growth speed is affected by the troughs, resulting in uneven growth.

Specifically, as shown in FIG. 9A, on the n-type GaN substrate 60 having troughs formed thereon, as epitaxial growth progresses, a top growth portion 90, a side growth portion 91, and a bottom growth portion 92 grow in an uncarved region 93, in the side face 94 of a carved region, and in the bottom face 95 of the carved region, respectively.

When a semiconductor thin film is grown in this way, the side growth portion 91, indicated with hatching in FIG. 9A, greatly affects the flatness of the top growth portion 90. As shown in FIG. 9A, let the film thickness of the side growth portion 91 be X.

It has been confirmed that, as the growth of the semiconductor thin film in the side growth portion 91 progresses as shown in FIG. 9B, the growth speed of the semiconductor thin film in the top growth portion 90 is affected to vary.

Specifically, the larger the film thickness X of the side growth portion 91, the lower the growth speed of the semiconductor thin film on the top growth portion 90, and thus the smaller the film thickness on the top growth portion 90. By contrast, the smaller the film thickness X of the side growth portion 91, the higher the growth speed of the semiconductor thin film on the top growth portion 90, and thus the greater the film thickness on the top growth portion 90. Thus, the film thickness of the semiconductor thin film on the surface of the top growth portion 90 varies greatly according to the film thickness X of the side growth portion 91.

The film thickness X of the side growth portion 91 varies from one place to another in the [1-100] direction because of the variation of the off angle within the surface, unevenness in the substrate itself such as the variation of the curvature thereof within the surface, unevenness of the epitaxial growth speed within the substrate surface, unevenness of the carving process within the substrate surface, and other factors. As a result, as discussed above, the flatness, within the wafer surface, of the semiconductor thin film laid on the surface of the top growth portion 90 is degraded.

Moreover, the greater the film thickness X of the side growth portion 91, the greater the variation, within the substrate surface, of the film thickness X of the side growth portion 91, and thus the more the flatness within the wafer surface is degraded. Thus, to obtain good flatness, the film thickness X of the top growth portion 90 needs to be reduced.

Moreover, the semiconductor thin film in the side growth portion 91 not only epitaxially grows directly on the side face, but its growth is also promoted by "creep-up growth," whereby the semiconductor thin film grown in the bottom growth portion 92 creeps up to the side growth portion 91.

FIG. 10 is a conceptual diagram illustrating how creep-up growth occurs from the bottom growth portion 92 of the carved region to the side growth portion 91. This creep-up growth further increases the film thickness X of the side growth portion 91 (see FIGS. 9A and 9B), and thereby affects the flatness within the wafer surface.

SUMMARY OF THE INVENTION

The present invention has been devised to solve the conventionally encountered problems discussed above. It is, therefore, an object of the present invention to prevent cracks that develop in a nitride semiconductor growth layer when it is laid on top of a nitride semiconductor substrate to produce a nitride semiconductor laser device. It is another object of the present invention to provide a nitride semiconductor laser device wherein a nitride semiconductor growth layer is formed with good surface flatness as a result of a reduced film thickness in a side growth portion achieved by reducing creep-up growth from a bottom growth portion of a carved region. It is still another object of the present invention to provide a method for fabricating such a nitride semiconductor laser device.

To achieve the above objects, according to the present invention, a nitride semiconductor light-emitting device is provided with: a nitride semiconductor substrate of which at least part of the surface is formed from a nitride semiconductor; and a nitride film semiconductor growth layer laid on the surface of the nitride semiconductor substrate. Here, a low-defect region having a defect density of $10^6$ cm$^{-2}$ or less and a carved region in the shape of a depressed portion are formed on the surface of the nitride semiconductor substrate. Moreover, the etching angle θ, which is the angle between the side face portion of the depressed portion and an extension line of the bottom face portion thereof as measured with the depressed portion seen in a sectional view, is in the range of $75° \leq \theta \leq 140°$.

In this structure, when the carved region in the shape of a depression is formed, by adjusting the etching angle of the sectional shape of the carved region within the range from 75° to 140°, it is possible to give it an inverted tapered shape. In this way, with the nitride semiconductor light-emitting device of the invention, it is possible to prevent the development of cracks in the nitride film semiconductor growth layer. Moreover, it is also possible to reduce the creep-up growth from the bottom growth portion of the carved region, and thereby to reduce the film thickness of the side growth portion.

It is preferable that the etching angle θ be 140° or less. The reason is that, with an etching angle b larger than 140°, it is difficult to fabricate the nitride semiconductor light-emitting device.

As described above, according to the present invention, when a nitride semiconductor growth layer is laid on top of a nitride semiconductor substrate to produce a nitride semiconductor laser device, a carved region in the shape of a depression is formed on the nitride semiconductor substrate. The etching angle in the sectional shape of the carved region is adjusted in the range from 75° to 140°, including the range in which the etching angle forms an inverted tapered shape.

With this structure, it is possible to prevent the development of cracks, and also to reduce the creep-up growth from the bottom growth portion of the carved region. Moreover, it is possible to reduce the film thickness of the side growth portion, and thus to form a nitride semiconductor growth layer with good surface flatness. As a result, it is possible to fabricate the nitride semiconductor laser device with a high yield.

This and other objects and features of the present invention will become clear from the following description, taken in conjunction with the preferred embodiments with reference to the accompanying drawings.

BRIEF DESCRIPTION OF THE DRAWINGS

FIG. 3A is a top view of FIG. 3B described below;

FIG. 3B is a schematic sectional view of the GaN substrate before the nitride semiconductor layer is grown in the embodiment of the invention;

FIG. 9A is a diagram illustrating how a top growth portion, a side growth portion, and a bottom growth portion grow in an uncarved region, in the side face portion of a carved region, and in the bottom face portion of the carved region, respectively;

FIG. 9B is a diagram illustrating how, as the growth of the semiconductor thin film in the side growth portion progresses, the growth speed of the semiconductor thin film growing in the top growth portion is affected to vary.

DETAILED DESCRIPTION OF PREFERRED EMBODIMENTS

Hereinafter, embodiments of the present invention will be described with reference to the accompanying drawings.

Figure 1:
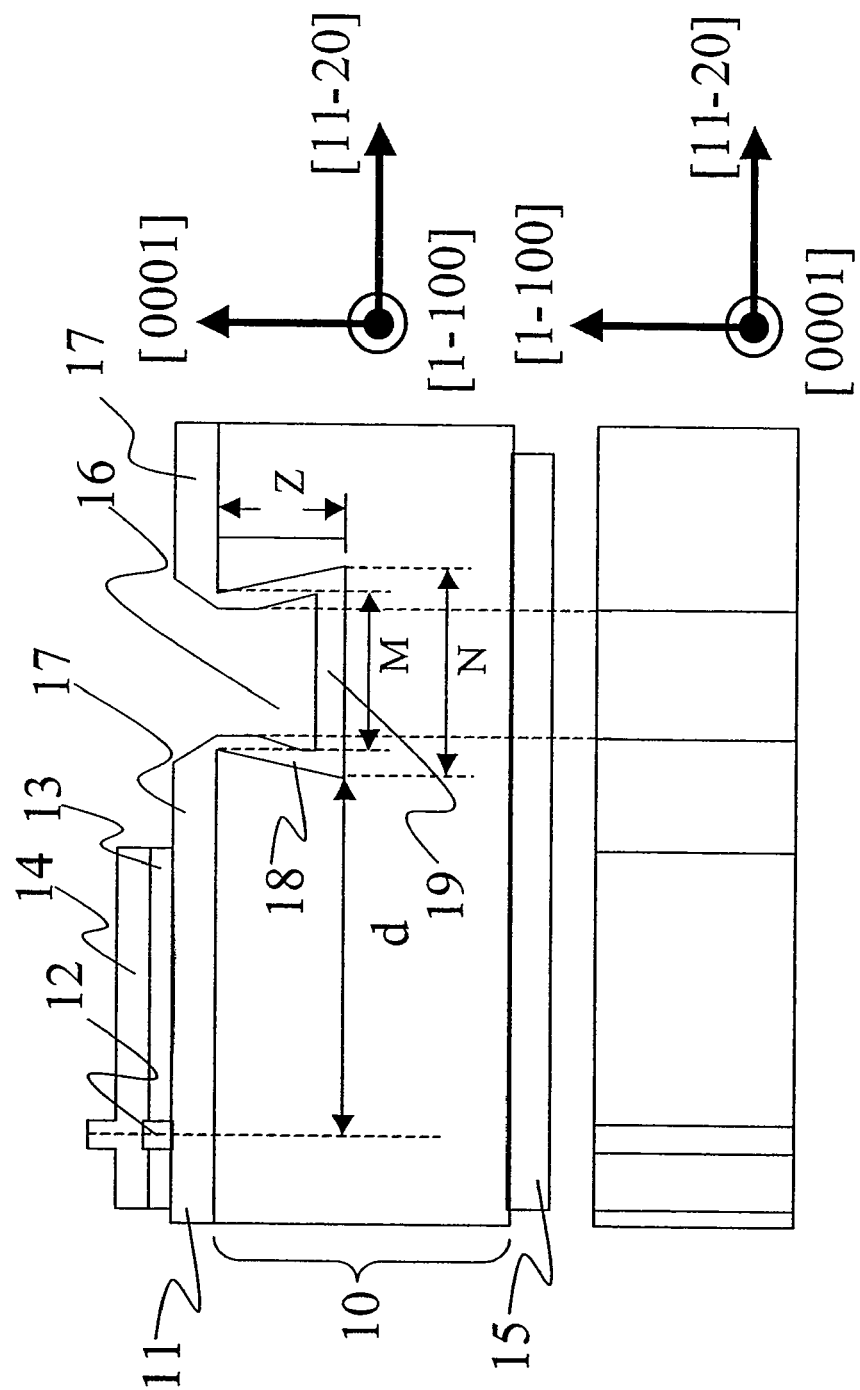
FIG. 1A is a schematic sectional view of a nitride semiconductor laser device embodying the invention.
FIG. 1B is a top view of FIG. 1A.

FIG. 1A is a schematic sectional view of a nitride semiconductor laser device embodying the invention, and FIG. 1B is a top view of FIG. 1A. FIG. 3B is a schematic sectional view of a GaN substrate before a nitride semiconductor layer is grown on top thereof in the embodiment of the invention, and FIG. 3A is a top view of FIG. 3B. In these diagrams, the surface orientations are also indicated.

The nitride semiconductor laser device shown in FIGS. 1A and 1B is produced by laying or otherwise forming a nitride semiconductor growth layer on top of the GaN substrate shown in FIGS. 3A and 3B.

In the following descriptions, a "nitride semiconductor substrate" is formed from $Al_xGa_yIn_z$ (where $0 \leq x \leq 1$, $0 \leq y \leq 1$, $0 \leq z \leq 1$, and $x+y+z=1$). So long as the nitride semiconductor substrate has a hexagonal crystal structure, about 10% or less of the nitrogen contained therein may be substituted with As, P, or Sb. Moreover, the nitride semiconductor substrate may be doped with Si, O, Cl, S, C, Ge, Zn, Cd, Mg, or Be. Particularly preferred doping materials for an n-type nitride semiconductor substrate are Si, O, and Cl.

The orientation of the principal plane of the nitride semiconductor substrate may be aligned with any of a C plane {0001}, an A plane {11-20}, an R plane {1-102}, an M plane {1-100}, and a {1-101} plane. So long as the principal plane of the substrate has an off angle less than 2° relative to the orientation of any of those crystal planes, good surface morphology is obtained.

The nitride semiconductor laser device of the embodiment is produced by growing a nitride semiconductor growth layer 11 on top of an n-type GaN substrate 10 having carved regions 16, in the shape of depressed portions, formed on the surface thereof. As shown in FIGS. 1A and 1B, the carved regions 16 have a sectional shape such that the width M of the opening of the carved regions 16 is smaller than the width N of the bottom face of the carved regions 16 (i.e., the carved regions 16 have an inverted tapered sectional shape).

Giving the carved regions 16 such a sectional shape helps reduce "creep-up growth" from a bottom growth portion 19, i.e., growth that starts from the bottom face of the carved regions 16. Doing so also helps reduce the film thickness X (see FIG. 2) of a side growth portion 18, which is formed by growth starting from the side faces of the carved regions 16. Consequently, higher evenness is achieved in the film thickness on a top growth portion 17, which is formed by growth starting from "uncarved regions," i.e., the surface of the n-type GaN substrate 10 elsewhere than in the carved regions 16.

Figure 2:
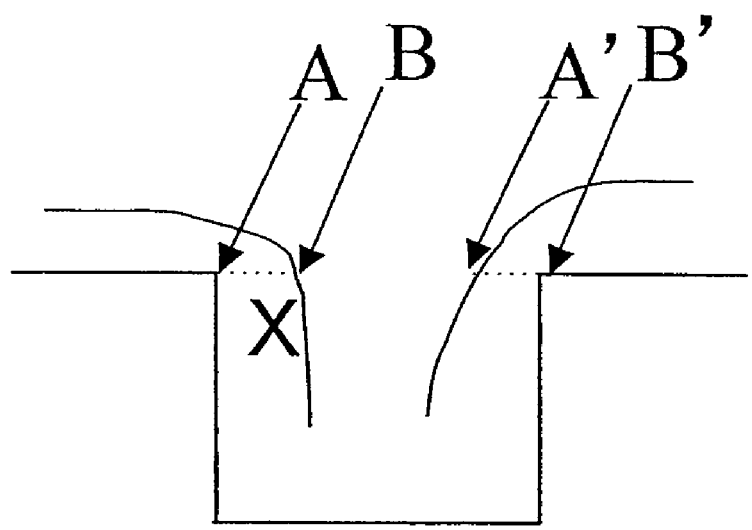
FIG. 2 is a diagram illustrating the film thickness X of the side growth portion.

Now, the definition of the film thickness X of the side growth portion 18 will be explained with reference to FIG. 2. As shown in FIG. 2, the film thickness X of the side growth portion 18 is defined as the distance from the end point A of an uncarved region to the point (the point B in FIG. 2) where the line parallel to the substrate surface and including the end point A intersects with the epitaxially grown film. If the film thickness X differs between both ends of the carved region 16, the thicker value is taken as the film thickness X.

In this embodiment, a substrate in which a nitride semiconductor including low-defect regions is exposed at the surface thereof is used. It is, however, also possible to use a substrate that is formed, except at the surface thereof, from sapphire, SiC, GaAs, Si, or ZnO so long as a nitride semiconductor growth layer can be laid on top thereof.

In connection with the nitride semiconductor laser device described above, first, with reference to the relevant drawings, how the "n-type GaN substrate before the laying of the nitride semiconductor growth layer on top thereof" is produced will be described.

First, on the entire surface of the n-type GaN substrate 10, a 1 μm thick layer of $SiO_2$ or the like is deposited by sputtering. Subsequently, by a common photolithography process, photoresist is formed in the [1-100] direction in the shape of stripes with a width (opening width) of 80 μm and with a period of 400 μm between adjacent stripes. Next, by RIE (respective ion etching), the $SiO_2$ layer and the GaN substrate are etched to form carved regions 16 with a carving depth Z of 6 μm. Thereafter, using HF (hydrofluoric acid) as an etchant, the $SiO_2$ layer is removed.

In this way, the n-type GaN substrate 10 before the nitride semiconductor growth layer is laid on the surface thereof as shown in FIGS. 3A and 3B is obtained.

The etching method used to produce the n-type GaN substrate 10 before the laying of the nitride semiconductor growth layer on top thereof may be dry etching or wet etching.

When dry etching is used, after the $SiO_2$ is etched, by performing wet etching, the carved regions 16 are formed to have an inverted tapered shape with an etching angle θ of 90° or more. Here, as shown in FIGS. 3A and 3B, the etching angle θ denotes the angle between the side face of the carved regions 16 and an extension line of the bottom face thereof.

The solution used in the wet etching here may be a KOH (potassium hydroxide) solution, a mixed solution of NaOH (sodium hydroxide) and KOH, or the like. Heating the solution to 80° C. to 250° C. makes isotropic etching possible, permitting the carved regions 16 to be formed to have an inverted tapered shape.

The n-type GaN substrate 10 used in this embodiment includes low-defect regions, which have a defect density of about $10^6$ $cm^{-2}$ or less. The carved regions 16 may be formed after first growing a thin film of GaN, InGaN, AlGaN, InAlGaN, or the like on top of the n-type GaN substrate 10 including the low-defect regions. Moreover, in this embodiment, for example, the etching angle θ may be 100°.

Figure 7:
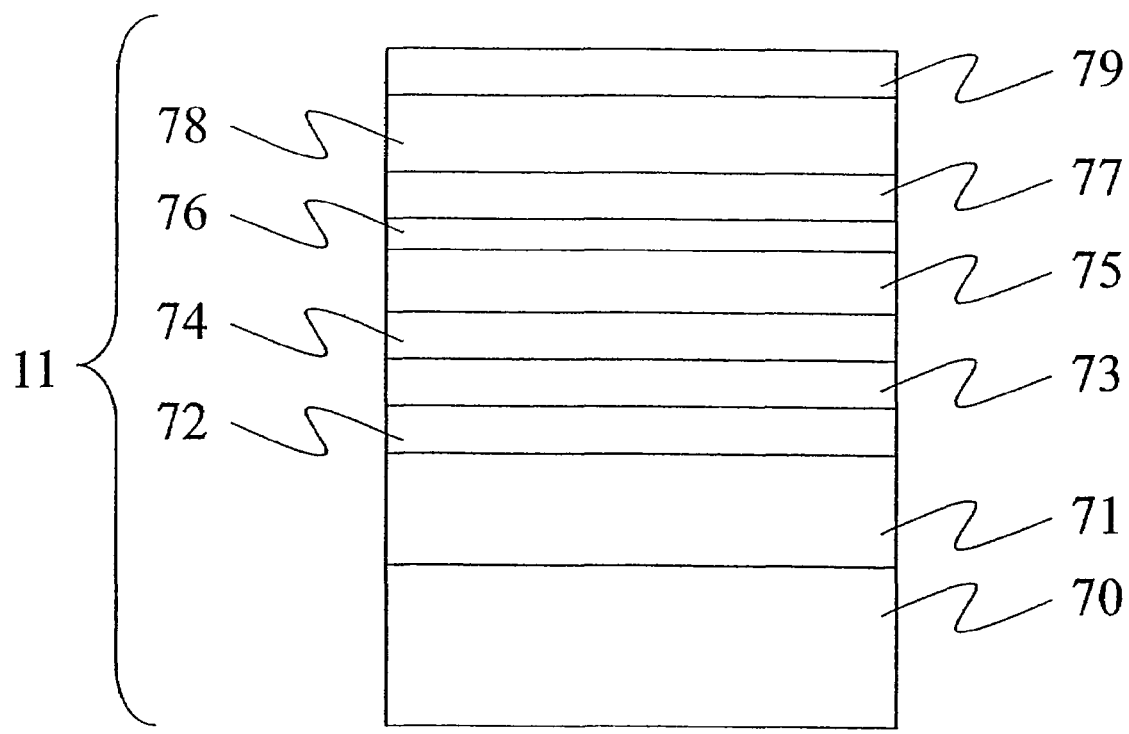
FIG. 7 is a schematic sectional view of a nitride semiconductor growth layer.
Figure 8:
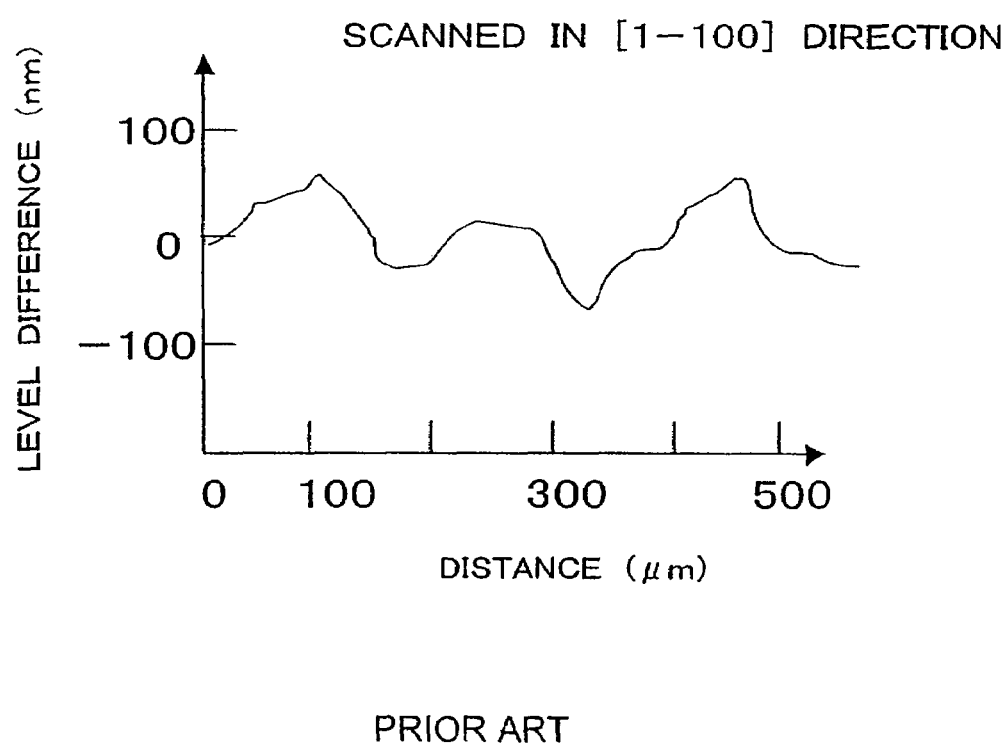
FIG. 8 is a graph showing the level difference across the surface of a wafer having a nitride semiconductor growth layer laid on top of a conventional n-type GaN substrate.
Figure 10:
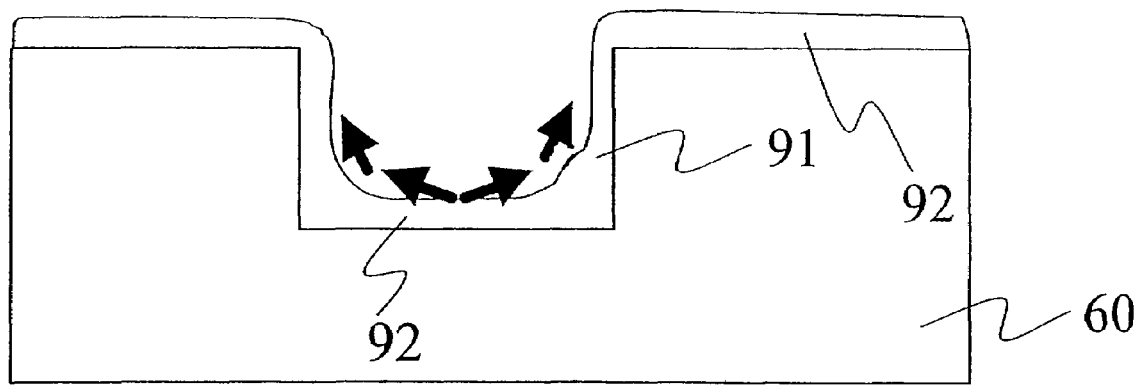
FIG. 10 is a diagram illustrating the growth mode of creep-up growth.

Then, on top of the substrate processed as descried above (i.e., on top of the n-type GaN substrate 10 before the laying of the nitride semiconductor growth layer on top thereof), by MOCVD or the like, a nitride semiconductor growth layer as shown in FIG. 7 is epitaxially grown to produce a nitride semiconductor laser device as shown in FIGS. 1A and 1B.

In the nitride semiconductor laser device shown in FIGS. 1A and 1B, on top of an n-type GaN substrate 10 produced as described above so as to have a carved region 16 formed thereon, a nitride semiconductor growth layer 11 having a multiple-layer structure as shown in FIG. 7 is formed. Moreover, on the surface of the nitride semiconductor growth layer 11, a laser stripe 12 functioning as a laser light waveguide (light-emitting portion) is formed, and in addition an $SiO_2$ layer 13 for current narrowing is formed so as to sandwich the laser stripe 12 from both sides.

Then, over the surfaces of the laser stripe (ridge stripe) 12 and the SiO2 layer 13, a p-type electrode 14 is formed. On the other hand, on the bottom surface of the n-type GaN substrate 10, an n-type electrode 15 is formed.

In the nitride semiconductor growth layer 11, the portion that is formed by growth from the surface of the n-type GaN substrate 10 elsewhere than in the carved region 16 is referred to as the top growth portion 17. The portion formed by growth from the side faces of the carved region 16 is referred to as the side growth portion 18. The portion formed by growth from the bottom face of the carved region 16 is referred to as the bottom growth portion 19.

It is preferable that the laser stripe 12 be formed above a low-defect region included in the n-type GaN substrate 10. Moreover, for the reason stated later, it is preferable that the laser stripe 12 not be formed above the carved region 16.

Using a light interference microscope, a wafer produced by laying the nitride semiconductor growth layer 11 on top of the n-type GaN substrate 10 having the carved region 16 formed thereon so as to have an inverted tapered shape as shown in FIGS. 1A and 1B was measured. Specifically, the thickness of the Mg-doped p-type layer was measured using a light interference microscope.

In this embodiment, the design thickness of the p-type layer is set at 0.700 μm. Using a light interference microscope, 20 measurements were taken at different places within the wafer surface, and the mean deviation σ of those measurements were calculated. As a result, the mean deviation a of the thickness of the p-type layer of this wafer was found to be 0.003.

It is believed that, to satisfactorily reduce the variation of the characteristics (such as FFP (far-field pattern), threshold current, and slope) of nitride semiconductor laser devices, the mean deviation σ needs to be reduced to 0.01 or lower. By this criterion, the mean deviation σ of the thickness of the p-type layer of the wafer in question can be said to be satisfactory, well above the required level.

For comparison, a nitride semiconductor laser device was produced in which the laser stripe 12 was formed above the carved region 16 on the n-type GaN substrate 10 having the nitride semiconductor growth layer 11 laid on top thereof. Then, in the same manner as described above, measurements were taken of the thickness of the p-type layer of the nitride semiconductor laser device, and the mean deviation σ of those measurements were calculated.

It was then found that, in the nitride semiconductor laser device having the laser stripe 12 located above the carved region 16, the mean deviation σ of the p-type layer was 0.06, indicating a large variation. This variation in layer thickness results from forming the laser stripe 12 above the carved region 16.

The side growth portion 18 causes the semiconductor thin film to grow from the side faces of the carved region 16 in a direction approximately perpendicular to those faces. In addition, creep-up growth from the bottom face of the carved region 16 occurs in the bottom growth portion 19. As a result, as compared with the top growth portion 17, the side and bottom growth portions 18 and 19 grow through a more complicated process, making it difficult to maintain the flatness of the device surface.

Thus, to reduce the variation of the thickness of the p-type layer, and to reduce the variation of the characteristics of the nitride semiconductor laser device, it is preferable that the laser stripe structure be formed in the top growth portion 17.

A study was also made of how the position where the laser stripe 12 is formed affects the nitride semiconductor laser device. First, as shown in FIG. 1A, let the distance from the center line of the laser stripe 12 to the end of the carved region 16 be d. Then, the laser stripe 12 was formed so that the distance d was 20 μm or less. This resulted in large variations in the characteristics of the nitride semiconductor laser device. This is because the thickness of the top growth portion 17 at the end thereof adjoining the carved region 16 is larger than the thickness of the top growth portion 17 at a central portion thereof, resulting in the formation of an abnormal growth portion.

Specifically, if the laser stripe 12 is formed so that the distance d is 20 μm or less, the abnormal growth portion lies over a width of about 20 μm from each end of the top growth portion 17, resulting in large variations in the characteristics of the nitride semiconductor laser device.

Thus, it is preferable that the laser stripe 12 be formed in a region to which the distance from the end of the top growth portion 17 is 20 μm or more. For example, in this embodiment, the distance d is set at 40 μm.

Forming the carved region 16 and then forming the laser stripe 12 elsewhere than above the carved region 16 as described above helps greatly reduce the variation of the characteristics of the nitride semiconductor laser device, and thus helps reduce the development of cracks in the nitride semiconductor layer. This leads to dramatically improved yields.

Figure 4:
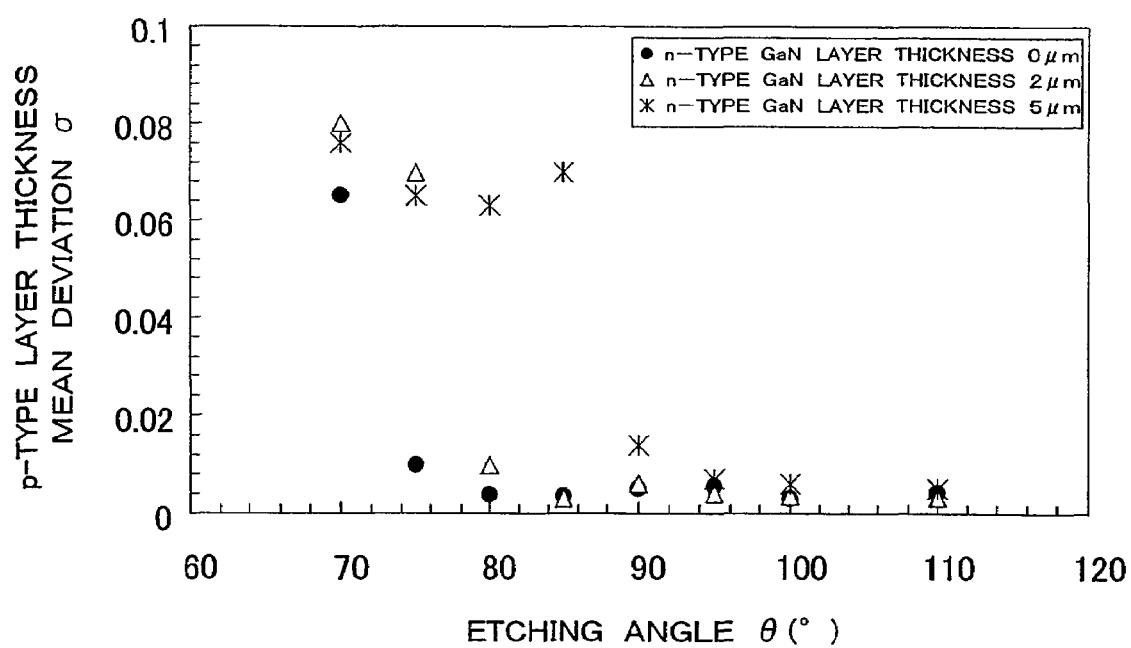
FIG. 4 is a diagram showing the correlation between the etching angle θ and the mean deviation of the p-type layer thickness.

FIG. 4 shows the relationship between the etching angle θ of the carved region 16 and the mean deviation σ that indicates the degree of variation of the thickness of the p-type layer before etching. Here, it is assumed that the layer thickness of the n-type GaN layer 70 (see FIG. 7) grown on the surface of the n-type GaN substrate 10 is 2 μm.

As described earlier, to reduce the variation of the characteristics of the nitride semiconductor laser device, the mean deviation σ of the thickness of the p-type layer needs to be 0.01 or less. The graph in FIG. 4 shows that, to meet the requirement that the mean deviation σ be 0.01 or less, the etching angle θ needs to be 80° or more.

The graph in FIG. 4 covers a range of etching angles θ up to 110°. In fact, the mean deviation θ of the thickness of the p-type layer was confirmed to be 0.01 or less up to 140°. With an etching angle θ greater than 140°, however, it is difficult to produce the nitride semiconductor laser device. Hence, it is preferable that the etching angle θ be 80° or more but 140° or less.

Incidentally, by varying the layer thickness of the n-type GaN layer 70 (see FIG. 7) grown on the surface of the n-type GaN substrate 10, it is possible to vary the etching angle that reduces the creep-up growth of the nitride semiconductor thin film. On the other hand, GaN is more prone to creep-up growth than AlGaN. This is because, as compared with AlGaN or the like, GaN is more prone to migration and thus to lateral growth.

That is, the greater the layer thickness of the n-type GaN layer 70 grown on the surface of the n-type GaN substrate 10, the greater the tendency for creep-up growth, and thus the greater the thickness of the side growth portion 18. Thus, to reduce this great tendency for creep-up growth, it is necessary to make the etching angle θ greater.

Hence, in a case where the layer thickness of the n-type GaN layer 70 is great, the etching angle θ needs to be made accordingly great. By contrast, in a case where the n-type GaN layer 70 is not grown on the surface of the n-type GaN substrate 10 (this corresponds to reducing the layer thickness of the n-type GaN layer 70 to 0 μm) but growth is started from the n-type $Al_{0.062}Ga_{0.938}N$ first clad layer 71 (see FIG. 7), even with a small etching angle θ, it is possible to reduce creep-up growth.

Specifically, as the graph in FIG. 4 shows, in a case where the layer thickness of the n-type GaN layer 70 is greater than 5 μm, to prevent the variation of the characteristics of the nitride semiconductor laser device, the mean deviation σ of the thickness of the p-type layer needs to be 0.01 or less. To achieve this, the etching angle θ needs to be 90° or more. For the reason stated earlier, it is preferable that the upper limit of the etching angle θ be 140° or less.

Moreover, as the graph in FIG. 4 shows, in a case where the n-type GaN layer 70 is not grown on the surface of the n-type GaN substrate 10, in which case the layer thickness thereof is 0 μm, but growth is started from the n-type $Al_{0.062}Ga_{0.938}N$ first clad layer 71 (see FIG. 7), to prevent the variation of the characteristics of the nitride semiconductor laser device, the mean deviation σ of the thickness of the p-type layer needs to be 0.01 or less. To achieve this the etching angle θ needs to be 75° or more.

Moreover, for the reason stated earlier, it is preferable that the upper limit of the etching angle θ be 140° or less. It should be noted that the measurements plotted in the graph in FIG. 4 were made with the carving depth Z of the carved region 16 set at 6 μm.

Now, the carving depth Z of the carved region 16 will be explained. If the carving depth Z is 1 μm or less, the carved region 16 is almost filled (making it difficult to form a trough), resulting in the development of cracks. Moreover, the creep-up growth from the bottom growth portion 19 greatly affects the side growth portion 18, greatly degrading the flatness. This is undesirable.

On the other hand, if the carving depth Z of the carved region 16 is 30 μm or more, it is extremely difficult to produce the nitride semiconductor laser device, resulting in lower repeatability and lower yields. This too is undesirable. Hence, it is preferable that the carving depth Z of the carved region 16 be in the range of 1 μm≦Z≦30 μm.

Figure 5:
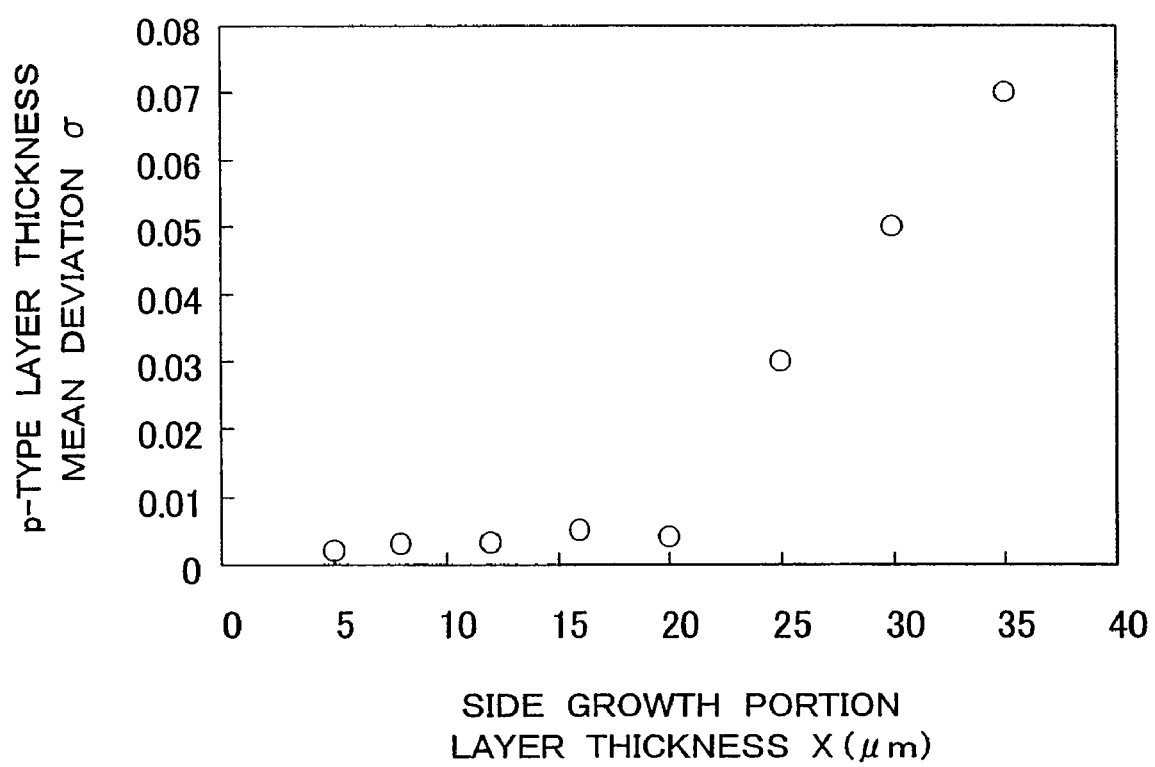
FIG. 5 is a diagram showing the correlation between the layer thickness X of the side growth portion and the mean deviation of the p-type layer thickness.
Figures 6A, 6B:
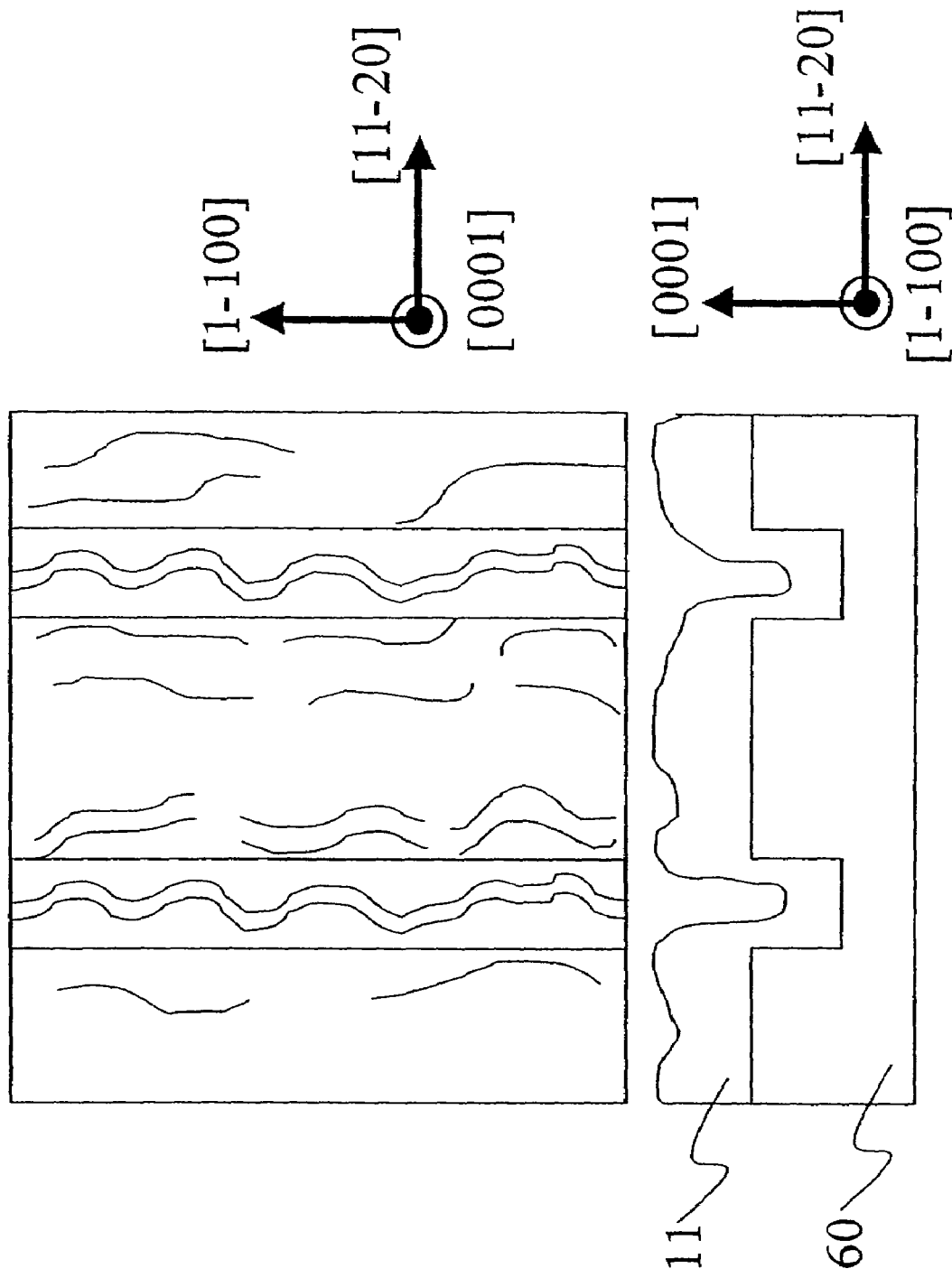
FIG. 6A is a top view of FIG. 6B described below.
FIG. 6B is a schematic sectional view of a wafer having a nitride semiconductor growth layer laid on top of a conventional n-type GaN substrate.

FIG. 5 shows the relationship between the thickness of the side growth portion 18 and the mean deviation σ that indicates the degree of variation of the thickness of the p-type layer before the etching for forming the ridge structure. The graph in FIG. 5 shows that, if the film thickness X of the side growth portion 18 is greater than 20 μm, the variation of the thickness of the p-type layer is very large.

Thus, to obtain satisfactory flatness, and to reduce the variation of the characteristics of the nitride semiconductor laser device, it is preferable that the film thickness X of the side growth portion 18 be 20 μm or less. As described earlier, the film thickness X of the side growth portion 18 is controlled by controlling the etching angle θ or the film thickness of the n-type GaN layer 70 or another layer laid beneath.

In this embodiment, the troughs and ridges shown in FIGS. 1A and 1B are formed in the shape of stripes that extend in one direction. It is, however, also possible to form the troughs and ridges so that they cross one another in a lattice-like (net-like) pattern.

The width of the troughs and the width of the ridges may vary with a fixed period, or may vary in any different manner. The depth of the troughs may be equal in all of the troughs formed, or may vary from one trough to the next.

The nitride semiconductor light-emitting device according to the invention and the method for fabricating it according to the invention described above can also be presented in the following manner.

In the nitride semiconductor light-emitting device according to the invention, the etching angle θ mentioned above may be in the range of 85°≦θ≦140°. It is particularly preferable that, in the nitride film semiconductor growth layer, the layer that makes contact with the surface of the nitride semiconductor substrate is a GaN layer, and that the layer thickness of this GaN layer be 2 μm or more.

A GaN layer is strongly prone to migration and thus to lateral growth. This tendency is striking particularly when the layer thickness of the GaN layer is greater than 2 μm. Thus, to reduce creep-up growth from the bottom growth portion of a carved region, and to reduce the film thickness of the side growth portion of the carved region, the etching angle θ needs to be set at 85° or more. The reason that the etching angle θ is 140° or less is the same as described earlier.

In a nitride semiconductor light-emitting device like this, the layer thickness of the GaN layer mentioned above may be 2 μm or less.

As described above, a GaN layer is strongly prone to migration and thus to lateral growth. However, the smaller the layer thickness of the GaN layer, the less noticeable the tendency becomes. Thus, setting the layer thickness of the GaN layer at 2 μm or less is effective in reducing creep-up growth from the bottom growth portion of the carved region and in reducing the film thickness of the side growth portion. In this case, it is further preferable that the etching angle θ be set at 80° or more. The reason that the etching angle θ is 140° or less is the same as described earlier.

In a nitride semiconductor light-emitting device like this, in the nitride film semiconductor growth layer mentioned above, the layer that makes contact with the surface of the nitride semiconductor substrate may be an AlGaN layer.

As descried above, a GaN layer is strongly prone to migration and thus to lateral growth. By contrast, an AlGaN layer is less prone to migration than a GaN layer.

Thus, when the layer thickness of the GaN layer is set at 0 μm, and the layer that makes contact with the surface of the nitride semiconductor substrate is an AlGaN layer, to reduce creep-up growth from the bottom growth portion of the carved region and to reduce the film thickness of the side growth portion, it suffices to set the etching angle θ at 75° or more. The reason that the etching angle θ is 140° or less is the same as described earlier.

In the nitride semiconductor light-emitting device described above, the carving depth of the carved region may be 1 μm or more but 30 μm or less.

Now, the carving depth of the carved region will be explained. If the carving depth is 1 μm or less, it is almost filled, resulting in the development of cracks. Moreover, in this case, the creep-up growth from the bottom growth portion strongly affects the side growth portion, greatly degrading the flatness. This is undesirable.

On the other hand, if the carving depth of the carved region is 30 μm or more, it is extremely difficult to produce the nitride semiconductor light-emitting device, leading to lower repeatability and lower yields. This too is undesirable. Hence, it is preferable that the carving depth of the carved region be 1 μm or more but 30 μm or less.

In the nitride semiconductor light-emitting device described above, the laser stripe formed as the light-emitting portion in the nitride semiconductor growth layer may be formed above the low-defect region elsewhere than above the carved region. In this case, the laser stripe may be formed 20 μm or more away from the carved region.

Forming the laser stripe so that the distance from the center line of the laser stripe to the carved portion is less than 20 μm results in large variations in the characteristics of the nitride semiconductor light-emitting device. This is because the film thickness of the top growth potion at the end thereof adjoining the carved portion is greater than the thickness of the top growth portion in a central portion thereof, resulting in the formation of an abnormal growth portion.

That is, in a case where an abnormal growth portion lies over a width of about 20 μm from each end of the top growth portion, forming the laser stripe in this region results in large variations in the characteristics of the nitride semiconductor light-emitting device. Thus, it is preferable that the laser stripe be formed in a region to which the distance from the end of the top growth portion is 20 μm or more.

In the nitride semiconductor light-emitting device described above, the film thickness of the side growth portion formed as part of the nitride film semiconductor growth layer on the side faces of the carved region may be 20 μm or less.

Giving the side growth portion a film thickness greater than 20 μm results in large variation in the thickness of the p-type layer. Thus, to obtain satisfactory flatness and to reduce the variation of the characteristics of the nitride semiconductor light-emitting device, it is preferable that the film thickness of the top growth portion be 20 μm or less.

The present invention also provides a method for fabricating a nitride semiconductor light-emitting device including, as described above: a nitride semiconductor substrate of which at least part of the surface is formed from a nitride semiconductor and that includes on the surface thereof a low-defect region having a defect density of $10^6$ cm$^{-2}$ or less; and a nitride film semiconductor growth layer formed on the surface of the nitride semiconductor substrate. The method includes: a first step of forming a carved region by etching the nitride semiconductor substrate; and a second step of laying the nitride semiconductor growth layer on the nitride semiconductor substrate that has undergone the first step. Here, in the first step, the etching angle θ, which is the angle between the side face of a depressed portion formed as the carved region and the extension line of the bottom face of the depressed portion, is in the range of $75°\leqq\theta\leqq140°$.

In the method for fabricating a nitride semiconductor light-emitting device described above, in the first step, the etching angle θ may be in the range of $85°\leqq\theta\leqq140°$.

In the method for fabricating a nitride semiconductor light-emitting device described above, in the second step, the layer that makes contact with the surface of the nitride semiconductor substrate may be a 2 μm or less thick GaN layer.

In the method for fabricating a nitride semiconductor light-emitting device described above, in the second step, the layer that makes contact with the surface of the nitride semiconductor substrate is an AlGaN layer.

In the method for fabricating a nitride semiconductor light-emitting device described above, a laser stripe functioning as a light-emitting portion may be formed above the low-defect region, elsewhere than above the carved region. In this case, the laser stripe may be formed 20 μm or more away from the carved region.

In any of the methods for fabricating a nitride semiconductor light-emitting device described above, the side growth portion formed, as part of the nitride film semiconductor growth layer, on the side face of the carved region may be 20 μm or less thick.

In any of the methods for fabricating a nitride semiconductor light-emitting device described above, in the first step, first a nitride semiconductor layer may be grown on the nitride semiconductor substrate, with the carved region formed thereafter.

Even when first the nitride semiconductor layer is grown before the carved region is formed, then the carved region is formed, and then the nitride semiconductor growth layer is laid on top, the effects of the present invention remain unaffected, making it possible to provide a nitride semiconductor light-emitting device wherein a nitride semiconductor growth layer is formed with good surface flatness.

The practical examples and embodiments specifically described hereinbefore are intended merely to clarify the technical features of the present invention. Accordingly, it should be understood that the present invention can be practiced in any other manners than specifically described above, with many variations and modifications made within the scope of the appended claims.

What is claimed is:

1. A nitride semiconductor light-emitting device, comprising:
    a nitride semiconductor substrate having a surface comprising a nitride semiconductor; and
    a nitride film semiconductor growth layer formed on the surface of the nitride semiconductor substrate,
    wherein a carved region that is a depressed portion having an inverted tapered shape in cross section is formed on the surface of the nitride semiconductor substrate,
    the nitride film semiconductor growth layer comprises a contact layer that makes contact with the surface of the nitride semiconductor substrate, the contact layer comprising a GaN film or an aluminum containing GaN film, and
    the nitride film semiconductor growth layer comprises a laser stripe configured to function as a light-emitting portion, the laser stripe being formed 20 μm or more away from the carved region.

2. A nitride semiconductor light-emitting device, comprising:
    a nitride semiconductor substrate having a surface comprising a nitride semiconductor; and
    a nitride film semiconductor growth layer formed on the surface of the nitride semiconductor substrate,
    wherein a carved region that is a depressed portion having a tapered shape in cross section is formed on the surface of the nitride semiconductor substrate,
    the nitride film semiconductor growth layer comprises a contact layer that makes contact with the surface of the nitride semiconductor substrate, the contact layer comprising a GaN film of 2 μm or less in thickness, and
    the nitride film semiconductor growth layer comprises a laser stripe configured to function as a light-emitting portion, the laser stripe being formed 20 μm or more away from the carved region.

3. A nitride semiconductor light-emitting device, comprising:
    a nitride semiconductor substrate having a surface comprising a nitride semiconductor; and
    a nitride film semiconductor growth layer formed on the surface of the nitride semiconductor substrate,
    wherein a carved region that is a depressed portion having a tapered shape in cross section is formed on the surface of the nitride semiconductor substrate,
    the nitride film semiconductor growth layer comprises a contact layer that makes contact with the surface of the nitride semiconductor substrate, the contact layer comprising an aluminum containing GaN film of 2 μm or less in thickness, and
    the nitride film semiconductor growth layer comprises a laser stripe configured to function as a light-emitting portion, the laser stripe being formed 20 μm or more away from the carved region.

4. A nitride semiconductor light-emitting device, comprising:

a nitride semiconductor substrate having a surface comprising a nitride semiconductor; and a nitride film semiconductor growth layer formed on the surface of the nitride semiconductor substrate, wherein a carved region that is a depressed portion is formed on the surface of the nitride semiconductor substrate, the nitride film semiconductor growth layer comprises a side growth portion formed on a side face of the carved region, the side growth portion having a thickness of 20 μm or less, and the nitride film semiconductor growth layer comprises a laser stripe configured to function as a light-emitting portion, the laser stripe being formed 20 μm or more away from the carved region.

5. The nitride semiconductor light-emitting device according to claim 4, wherein the nitride film semiconductor growth layer comprises a contact layer that makes contact with the surface of the nitride semiconductor substrate, the contract layer comprising a GaN film of 2 μm or less in thickness.

6. The nitride semiconductor light-emitting device according to claim 4, wherein the nitride film semiconductor growth layer comprises a contact layer that makes contact with the surface of the nitride semiconductor substrate, the contact layer comprising an aluminum containing GaN film.

7. The nitride semiconductor light-emitting device according to claim 1, wherein an orientation of a principal plane of the nitride semiconductor substrate has a off angle of 2° or less relative to an orientation of a crystal plane.

* * * * *